(12) United States Patent
Kawagoe et al.

(10) Patent No.: US 8,858,039 B2
(45) Date of Patent: Oct. 14, 2014

(54) ILLUMINATING APPARATUS

(75) Inventors: Shinya Kawagoe, Osaka (JP); Naotaka Hashimoto, Osaka (JP); Toshiyasu Kojima, Osaka (JP); Taku Ikeda, Osaka (JP); Akira Taniuchi, Osaka (JP)

(73) Assignee: Panasonic Corporation, Osaka (JP)

( * ) Notice: Subject to any disclaimer, the term of this patent is extended or adjusted under 35 U.S.C. 154(b) by 20 days.

(21) Appl. No.: 13/132,895

(22) PCT Filed: Dec. 9, 2009

(86) PCT No.: PCT/JP2009/006727
§ 371 (c)(1),
(2), (4) Date: Jun. 3, 2011

(87) PCT Pub. No.: WO2010/084546
PCT Pub. Date: Jul. 29, 2010

(65) Prior Publication Data
US 2011/0233593 A1 Sep. 29, 2011

(30) Foreign Application Priority Data

Jan. 20, 2009 (JP) ................. 2009-010178
Feb. 27, 2009 (JP) ................. 2009-045543

(51) Int. Cl.
| *F21V 29/00* | (2006.01) |
| *H01L 33/60* | (2010.01) |
| *F21K 99/00* | (2010.01) |
| *F21V 11/14* | (2006.01) |
| *F21V 7/20* | (2006.01) |
| *F21V 7/09* | (2006.01) |
| *F21Y 101/02* | (2006.01) |

(52) U.S. Cl.
CPC ............ *H01L 33/60* (2013.01); *F21V 29/2293* (2013.01); *F21V 29/2281* (2013.01); *F21V 29/242* (2013.01); *F21K 9/137* (2013.01); *F21V 11/14* (2013.01); *F21V 29/2206* (2013.01); *F21V 7/20* (2013.01); *F21V 7/09* (2013.01); *F21V 29/004* (2013.01); *F21Y 2101/02* (2013.01)
USPC .......................................... 362/373; 362/294

(58) Field of Classification Search
CPC ...... F21V 29/004; F21Y 2101/02; F21K 9/00
USPC ................................................. 362/294, 373
See application file for complete search history.

(56) References Cited

U.S. PATENT DOCUMENTS 4,021,659 A 5/1977 Wiley
6,979,107 B1 12/2005 Benensohn
(Continued)

FOREIGN PATENT DOCUMENTS

CN 2781168 5/2006
CN 101078495 11/2007
(Continued)

OTHER PUBLICATIONS

Chinese Patent Application No. 200980154478.7 Office Action dated Mar. 20, 2013, 11 pages.
(Continued)

*Primary Examiner* — Sean Gramling

(57) ABSTRACT

Provided is a lighting apparatus that is suitable as a substitute for a conventional halogen lamp when positively utilizing leaked light. The lighting apparatus comprises: a heat dissipator 12 that is in one of a bottomed cylindrical shape and a bowl shape, and that has a bottom portion, a circumferential wall portion, and an opening; and a light-emitting device 18b that is provided inside the heat dissipator 12 at the bottom portion and is operable to emit light, wherein the heat dissipator 12 has one or more windows 19 for leaking the emitted light outside the heat dissipator 12.

12 Claims, 20 Drawing Sheets

(56) References Cited

U.S. PATENT DOCUMENTS

| | | | |
|---|---|---|---|
| 7,985,005 B2 | 7/2011 | Alexander et al. | |
| 2004/0057234 A1* | 3/2004 | Mohacsi | 362/231 |
| 2004/0264197 A1 | 12/2004 | Bewig et al. | |
| 2005/0073849 A1 | 4/2005 | Rhoads et al. | |
| 2005/0111234 A1 | 5/2005 | Martin et al. | |
| 2005/0281047 A1 | 12/2005 | Coushaine et al. | |
| 2007/0019413 A1 | 1/2007 | Moore et al. | |
| 2007/0195527 A1 | 8/2007 | Russell | |
| 2007/0268706 A1 | 11/2007 | Wagener et al. | |
| 2009/0003009 A1 | 1/2009 | Tessnow et al. | |
| 2009/0021945 A1 | 1/2009 | Holder et al. | |
| 2009/0213595 A1* | 8/2009 | Alexander et al. | 362/373 |
| 2010/0002444 A1 | 1/2010 | Konaka | |

FOREIGN PATENT DOCUMENTS

| | | |
|---|---|---|
| CN | 201028339 | 2/2008 |
| CN | 101191588 | 6/2008 |
| CN | 101344227 | 1/2009 |
| EP | 0136684 | 4/1985 |
| GB | 1504689 | 3/1978 |
| JP | 58-144317 | 9/1983 |
| JP | 64-084506 | 3/1989 |
| JP | H1-86007 | 6/1989 |
| JP | 1990-121749 | 10/1990 |
| JP | 8-185834 | 7/1996 |
| JP | 10-069808 | 3/1998 |
| JP | 2001-307535 | 11/2001 |
| JP | 2006-202612 | 8/2006 |
| JP | 2007-317431 | 12/2007 |
| JP | 3144139 | 8/2008 |
| JP | 3147051 | 11/2008 |
| JP | 3162155 | 7/2010 |
| WO | WO 2008/035694 | 3/2008 |

OTHER PUBLICATIONS

Japanese Application No. 2011-021703 Office Action dated Nov. 1, 2011, 2 pages.
Japanese Application No. 2011-021703 Office Action dated Jan. 10, 2012, 5 pages.
Japanese Patent Application No. 2010-547317 Office Action dated Jun. 18, 2013, 3 pages.
U.S. Appl. No. 13/762,243 Office Action dated Nov. 13, 2013.
Chinese Patent Application No. 200980154478.7 Office Action dated Sep. 22, 2013; 22 pages including partial English translation.
European Application No. 09838740.0 Extended European Search Report dated Mar. 24, 2014, 11 pages.

* cited by examiner

ILLUMINATING APPARATUS

TECHNICAL FIELD

The present invention relates to a lighting apparatus including a light-emitting device such as an LED (Light Emitting Diode).

BACKGROUND ART

As a lighting apparatus such as spot lighting in a commercial facility or a private residence, a reflector halogen lamp has been widely prevalent.

Meanwhile, importance is placed on saving power consumption and improving life in the field of spot lighting. Accordingly, research and development are carried out on technology for substituting a lighting apparatus including an LED (hereinafter "LED lighting apparatus") for a conventional light bulb. Reflector halogen lamps are no exceptions, and a number of reflector LED lighting apparatuses have been proposed as substitutes for such reflector halogen lamps (see Patent Literatures 1 and 2).

In general, an LED produces heat when lit, and the higher the temperature of the LED is, the lower the light-emitting efficiency of the LED is. Therefore, in the practical application of an LED lighting apparatus, it is an important issue to improve heat dissipation characteristics without violating the size limitation, which requires the LED lighting apparatus to have a size attachable to existing equipment. To address the above issue, technology is proposed that utilizes a reflector LED lighting apparatus also as a heat dissipator by employing a metal reflector (see Patent Literature 3, for example). According to this technology, the heat dissipation characteristics of the reflector LED lighting apparatus are improved without violating the size limitation.

CITATION LIST

Patent Literature

[Patent Literature 1]
Japanese Patent Application Publication No. 2007-317431
[Patent Literature 2]
Japanese Registered Utility Model No. 3153732
[Patent Literature 3]
Japanese Patent Application Publication No. 2006-202612

SUMMARY OF INVENTION

Technical Problem

In a conventional reflector halogen lamp, a reflector is generally made by forming a reflective film (e.g., vapor-deposited metal film or dielectric multilayer film) on an inner circumferential surface of a bowl-shaped glass base. However, the reflective film is not usually formed on a neck portion of the glass base because the halogen lamp is fixed to the neck portion with use of an adhesive agent. When such a reflector halogen lamp is lit, light of the halogen lamp is emitted from an opening of a reflector, and is also emitted as leaked light from a neck portion that does not include a reflective film. In a commercial facility or the like, the leaked light is positively utilized to enhance "perceived brightness" of the entire space.

However, each of the aforementioned conventional reflector LED lighting apparatuses employs a metal reflector. Therefore, light of an LED is only emitted from an opening of the metal reflector, and leaked light is not produced. Accordingly, in the case of positively utilizing leaked light, these reflector LED lighting apparatuses are not suitable as substitutes for conventional halogen lamps.

Also, a reflector halogen lamp is sometimes used as spot lighting in a store or the like. In this case, facets are formed on a reflector of the halogen lamp so as to control light distribution. Accordingly, when an LED lighting apparatus substitutes for such a halogen lamp, it is necessary that facets are also formed on a reflector of the LED lighting apparatus so as to appropriately control light distribution.

However, if a reflector is made of metal, a special processing technique is required to form facets on the reflector, resulting in the manufacturing cost being significantly increased. Furthermore, spot lighting is required to have various light distribution patterns. This means that a different metal reflector needs to be prepared for each light distribution pattern. As a result, an increase in the manufacturing cost becomes even more problematic.

A first object of the present invention is to provide a lighting apparatus that substitutes for a conventional halogen lamp when positively utilizing leaked light.

A second object of the present invention is to provide a technique for controlling light distribution at low cost while maintaining high heat dissipation characteristics.

Solution to Problem

A first aspect of the present invention is a lighting apparatus comprising: a heat dissipator that is in one of a bottomed cylindrical shape and a bowl shape, and that has a bottom portion, a circumferential wall portion, and an opening; and a light-emitting device that is provided inside the heat dissipator at the bottom portion and is operable to emit light, wherein the heat dissipator has one or more windows for leaking the emitted light outside the heat dissipator.

A second aspect of the present invention is a lighting apparatus comprising: a heat dissipator that is in one of a bottomed cylindrical shape and a bowl shape, and that has a bottom portion, a circumferential wall portion, and an opening; a light-emitting device that is provided inside the heat dissipator at the bottom portion and is operable to emit light; and a reflector that is bowl-shaped and provided in the heat dissipator, and is operable to reflect the emitted light toward the opening, wherein the reflector is made of a base and a reflective film that covers the base, and the base is made of one of resin and glass, and has facets.

Advantageous Effects of Invention

According to the first aspect of the present invention, the light of the light-emitting device is emitted from the opening of the heat dissipator that is in one of a bottomed cylindrical shape and a bowl shape, and also leaked outside the heat dissipator through the one or more windows provided in the circumferential wall portion of the heat dissipator. Therefore, the lighting apparatus according to the first aspect of the present invention is suitable as a substitute for a conventional halogen lamp when positively utilizing leaked light.

Also, according to the second aspect of the present invention, the reflector is made of one of resin and glass. This makes it easy to form the facets on the base. Furthermore, since the heat dissipator 12 and the reflector 30 are separate members, a structure is possible where the heat dissipator 12 is commonly used while the reflector 30 is different depending on a light distribution pattern. This makes it possible to

DESCRIPTION OF EMBODIMENTS

The following describes embodiments of the present invention, with reference to the drawings.

Embodiment 1

Figure 1:
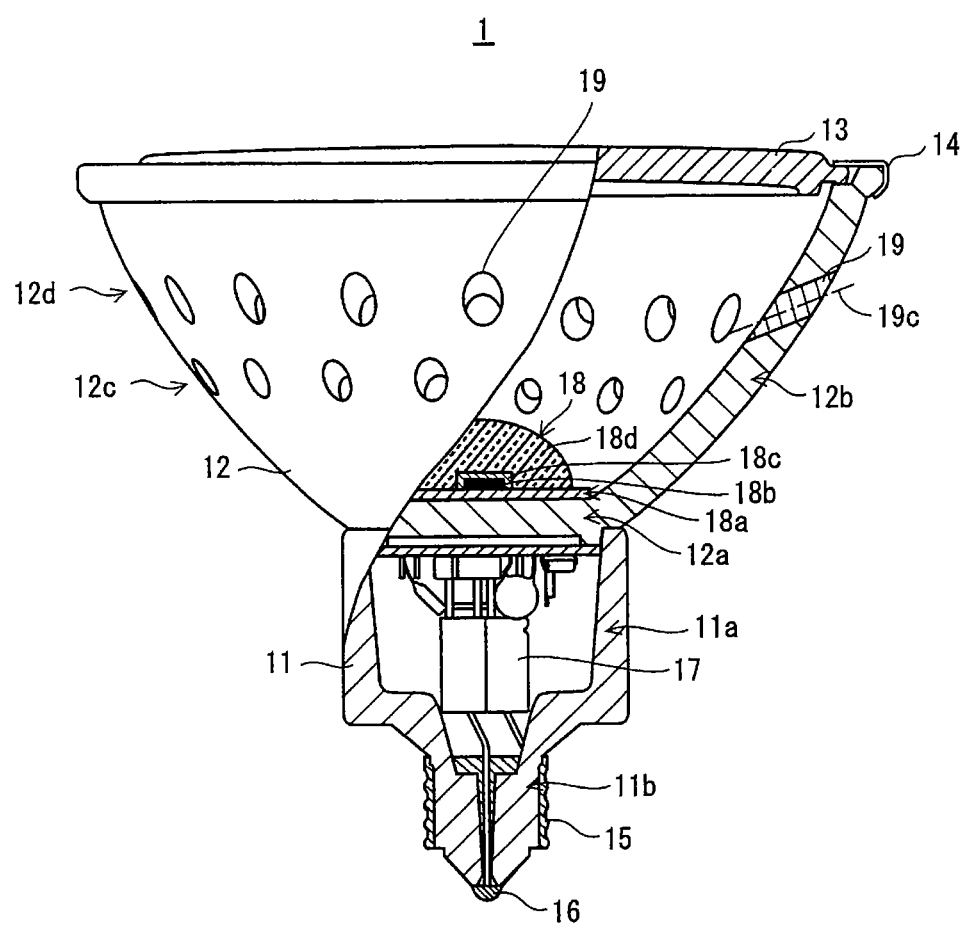
FIG. 1 is a partial cutaway view showing a structure of a lighting apparatus according to Embodiment 1 of the present invention.

FIG. 1 is a partial cutaway view showing a structure of a lighting apparatus according to Embodiment 1 of the present invention.

A lighting apparatus 1 includes, as main components thereof, a case 11, a heat dissipator 12, and a light-emitting module 18. First, a schematic structure of each of these components is described. Then, a detailed structure of the heat dissipator 12 is described.

<Schematic Structure>

The case 11 is made of an insulating material such as ceramics, and is composed of a cylindrical portion 11a and a protrusion 11b. The protrusion 11b extends from an end of the cylindrical portion 11a. The cylindrical portion 11a houses therein a lighting circuit 17. A shell 15, which is made of metal, is provided on an outer circumferential surface of the protrusion 11b. An end of the protrusion 11b is provided with an eyelet 16, which is also made of metal. Both of the shell 15 and the eyelet 16 are connected to the lighting circuit 17 via wiring lines, and serve as feed terminals that receive power supplied from an external power source.

The heat dissipator 12 is made of a heat dissipating material, and is bowl-shaped with a bottom portion 12a and a circumferential wall portion 12b. The circumferential wall portion 12b extends from the rim of the bottom portion 12a. The heat dissipating material may be, for example, a metal material such as aluminum, a non-translucent ceramic material, a non-translucent resin material, or a combination of these materials (e.g., multilayer structure). In general, a resin material has lower heat conductivity than a metal material or a ceramic material. However, it is possible to use a resin material as a heat dissipating material, as long as the heat value of the light-emitting module 18 is relatively low. In the case of using a resin material, it is more preferable to employ a highly heat-conductive resin. The light-emitting module 18 is fixed to an inner surface of the bottom portion 12a of the heat dissipator 12, with use of an adhesive agent having heat conductivity. The case 11 is fixed to an outer surface of the bottom portion 12a, with use of the adhesive agent. An opening of the heat dissipator 12 is covered by a front cover 13, with use of a metal fitting 14. The front cover 13 is made of a translucent material. The translucent material may be, for example, resin, glass, or ceramics. The circumferential wall portion 12b of the heat dissipator 12 has windows 19 through which light emitted from the light-emitting module 18 leaks. An inner circumferential surface of the heat dissipator 12 reflects light except the parts where the windows 19 are provided, so that the heat dissipator 12 also serves as a reflector. The size of the heat dissipator 12 is substantially equal to or smaller than the size of an existing reflector halogen lamp. For example, suppose that the lighting apparatus 1 substitutes for a reflector halogen lamp, and the reflector of the halogen lamp has an opening diameter in a range of approximately 50 mm to 70 mm. In this case, the opening diameter of the heat dissipator 12 may be in the range of approximately 50 mm to 70 mm or smaller.

The light-emitting module 18 is composed of a metal substrate 18a, an LED device 18b, a silicone resin member 18c, and a lens 18d. The metal substrate 18a is formed in the following manner. First, an insulating film, such as a resin film, is formed on an upper surface of a metal base, such as copper. Next, a wiring pattern is formed on the insulating film. The wiring pattern is connected to the lighting circuit 17 by a wiring line. The LED device 18b is a so-called blue light-emitting diode, and is mounted on the wiring pattern formed on the metal substrate 18a. The silicone resin member 18c is formed to enclose the LED device 18b, and is made by dispersing yellow phosphor in a silicone resin. The LED device 18b is combined with the silicone resin member 18c so as to obtain white light. The lens 18d is formed to enclose the silicone resin member 18c, and is made of a translucent material such as resin. The light-emitting module 18 is arranged such that the optical axis of the light-emitting module 18 coincides with the central axis of the heat dissipator 12 that is bowl-shaped.

The lighting apparatus 1 is used by being mounted in a socket provided in a commercial facility or the like. The light emitted from the light-emitting module 18 is provided as spot lighting after passing through the front cover 13 from the opening of the heat dissipator 12, and also as leaked light after passing through the windows 19 provided in the circumferential wall portion 12b of the heat dissipator 12. This enhances the "perceived brightness" of the entire space of a commercial facility or the like, with use of leaked light.

Also, heat generated by lighting the LED device 18b is conducted to the heat dissipator 12 via the heat-conductive adhesive agent and the metal substrate 18a that is a heat-conductive member, thereby dissipating heat effectively.

<Detailed Structure of Heat Dissipator>

As shown in FIG. 1, the circumferential wall portion 12b of the heat dissipator 12 has the plurality of windows 19. Some of the windows 19 are arranged in a circumferential area 12c at equal intervals, and the rest of the windows 19 are arranged in a circumferential area 12d at equal intervals. The circumferential area 12d is located closer to an opening edge of the heat dissipator 12 than the circumferential area 12c. In each of the circumferential areas 12c and 12d, the windows 19 are arranged at equal intervals in a circumferential direction. This enables the light distribution of the leaked light to be symmetrical in the circumferential direction.

The windows 19 in the circumferential area 12d have a size larger than those in the circumferential area 12c. This makes it possible to leak more light at an angle close to a direction in which spot lighting is emitted, thereby increasing the illuminance in the vicinity of a main irradiation area.

The windows 19 are formed such that through-holes provided in the circumferential wall portion 12b of the heat dissipator 12 are closed off by translucent members. The translucent members may be made of, for example, resin, glass, or ceramics. Closing off the through-holes by the translucent members prevents foreign substances, such as moisture and dust, from entering the heat dissipator 12. The translucent members may be colorless or colored. If colored, the translucent members function as color filters. Some conventional halogen lamps have reflectors using dichroic filters. When such halogen lamps are lit, the coloration of leaked light may be specific (e.g., red). Therefore, the translucent members may be colored in a manner that reproduces the specific color, so that the lighting apparatus 1 is more suitable as a substitute for each halogen lamp.

Each of the through-holes of the windows 19 is arranged such that the light-emitting module 18 is located on an extended line of a central axis 19c of the through-hole. In this way, light emitted from the light-emitting module 18 is leaked from the windows 19, thus improving the "perceived radiance" of the lighting apparatus 1.

Note that in a conventional halogen lamp, the light distribution is controlled by a reflector, whereas in the lighting apparatus 1, the light distribution is mainly controlled by the lens 18d. As a result, in the lighting apparatus 1, direct light from the light-emitting module 18 greatly contributes to spot lighting, but reflected light on the inner circumferential surface of the heat dissipator 12 does not contribute much to the spot lighting. This means that the windows 19 provided in the circumferential wall portion 12b of the heat dissipator 12 do not affect the brightness of the spot lighting.

<Modifications>

The following modifications are acceptable in Embodiment 1 described above.

Figure 2:
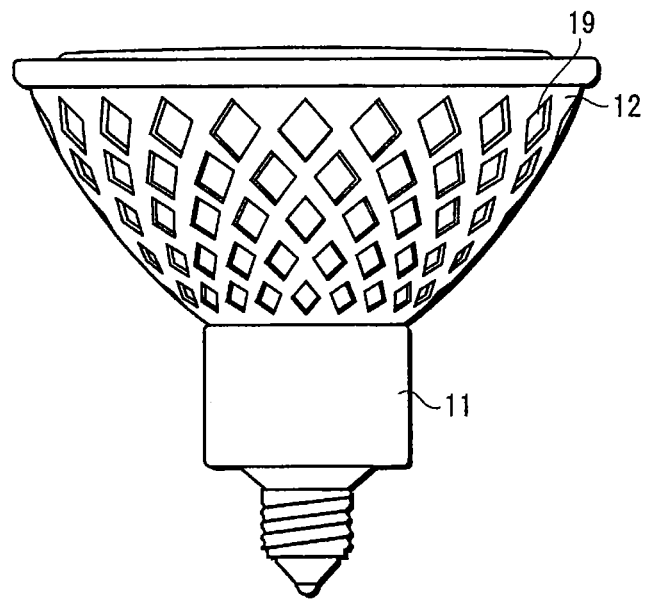
FIG. 2 shows a modification pertaining to the shape of windows provided in a heat dissipator.
Figure 3:
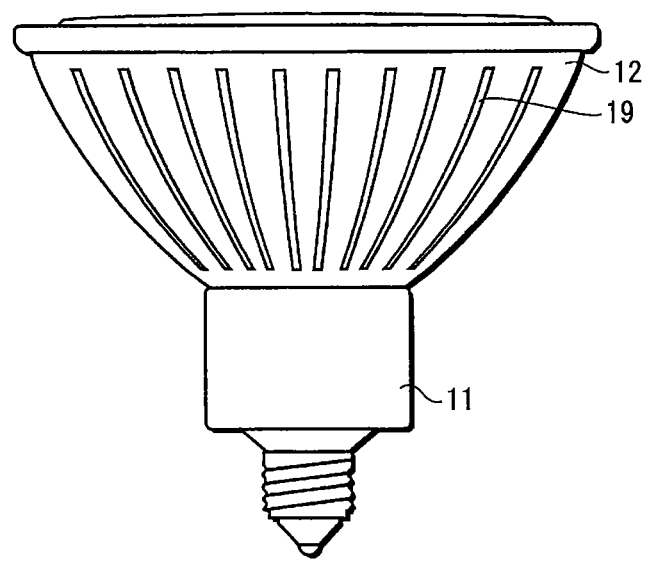
FIG. 3 shows a modification pertaining to the shape of the windows provided in the heat dissipator.

(1) According to Embodiment 1, the shape, number, and position of the windows 19, and the relative size of the windows 19 with respect to the heat dissipator 12 are specifically illustrated. However, the present invention is not limited to such. For example, the windows 19 may be rhombus-shaped and arranged like facets, as shown in FIG. 2. Alternatively, the windows 19 may be slit-shaped and arranged at equal intervals in a circumferential direction, as shown in FIG. 3. In the case where the windows 19 are slit-shaped, each slit does not always need to be a longitudinal slit as shown in FIG. 3, but may be a lateral slit.

Figure 4:
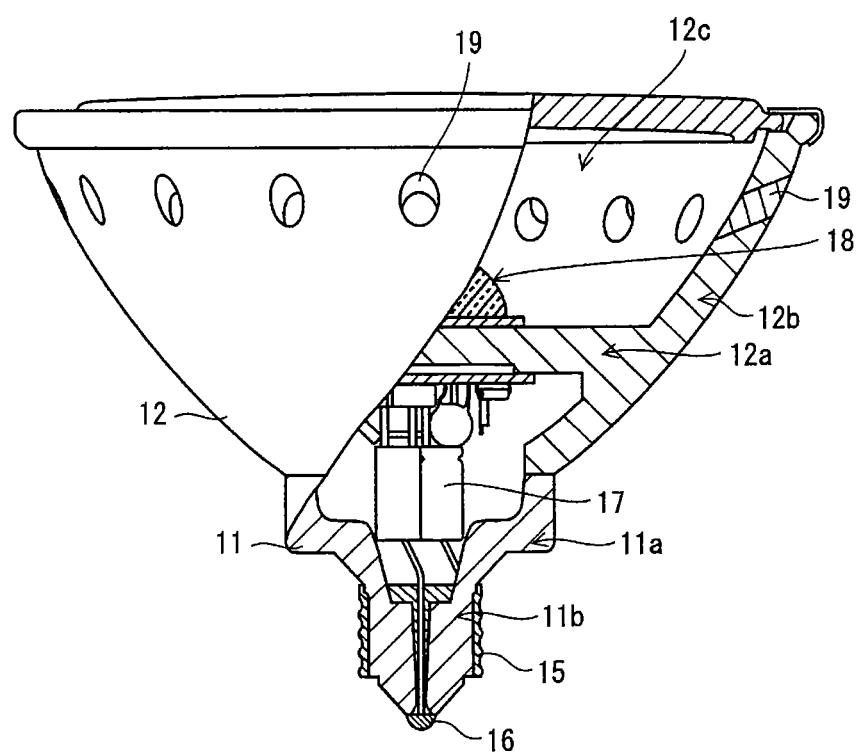
FIG. 4 shows a modification pertaining to the positional relationship between a bottom portion and circumferential wall portion of the heat dissipator.

(2) According to Embodiment 1, the bottom portion 12a of the heat dissipator 12 is positioned at an edge of the circumferential wall portion 12b. However, the present invention is not limited to such. For example, the bottom portion 12a may be positioned at a middle part of the circumferential wall portion 12b, as shown in FIG. 4. This makes it possible to provide a larger space for housing the lighting circuit 17. In this case, the windows 19 are provided in an area of the circumferential wall portion 12b, which is located between a virtual plane including the opening of the heat dissipator 12 and a virtual plane that is perpendicular to the central axis of the heat dissipator 12 and passes through the light-emitting module 18.

Figure 5A:
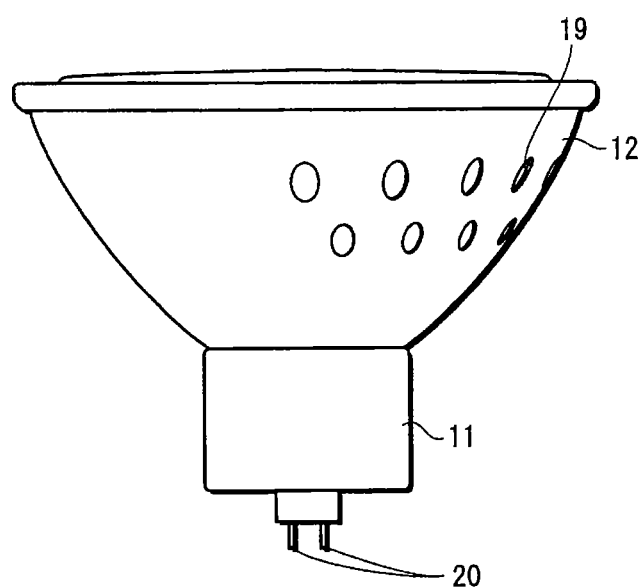
FIGS. 5A and 5B are a side view and a bottom view, respectively, showing a modification pertaining to the arrangement of the windows provided for the heat dissipator.
Figure 5B:
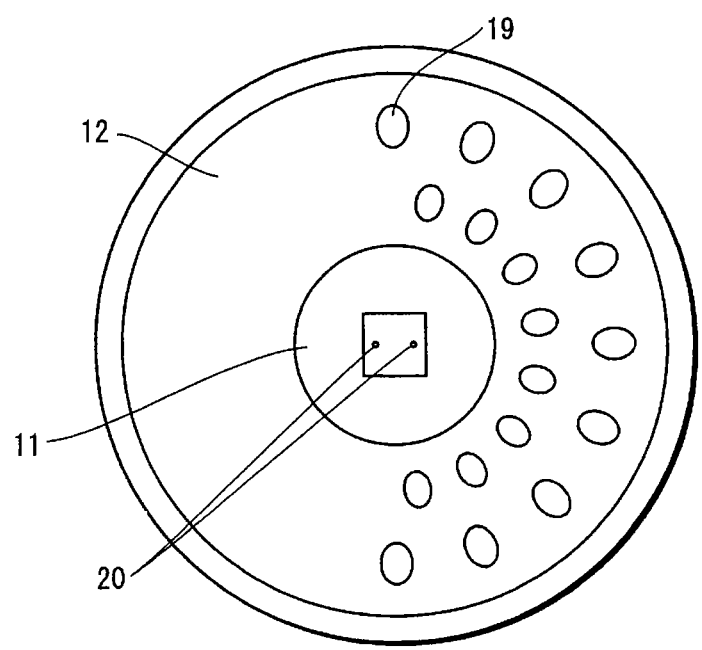

(3) According to Embodiment 1, the windows 19 are provided along the entire circumference of the circumferential wall portion 12b. However, the present invention is not limited to such. For example, the windows 19 may be provided in a part of the circumferential wall portion 12b in the circumferential direction, as shown in FIGS. 5A and 5B. This enables the light distribution of the leaked light to be asymmetrical in the circumferential direction. Providing the windows 19 in such a manner is particularly useful when feed pins 20 are employed as feed terminals, as shown in FIGS. 5A and 5B. This is because the direction of the lighting apparatus 1 is fixed when attached to equipment.

Figure 6A:
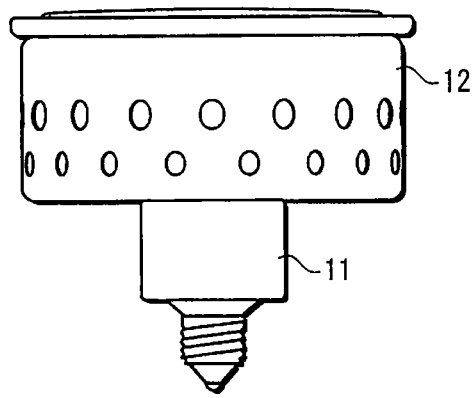
FIGS. 6A, 6B, and 6C each show a modification pertaining to the shape of the dissipator.
Figure 6B:
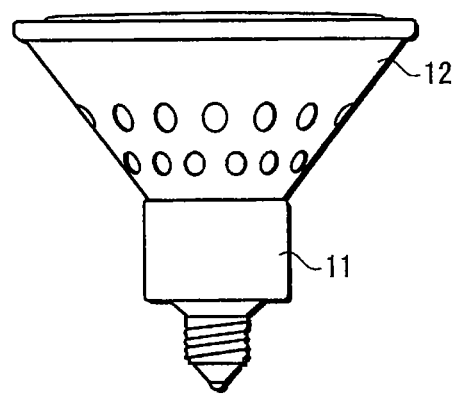
Figure 6C:
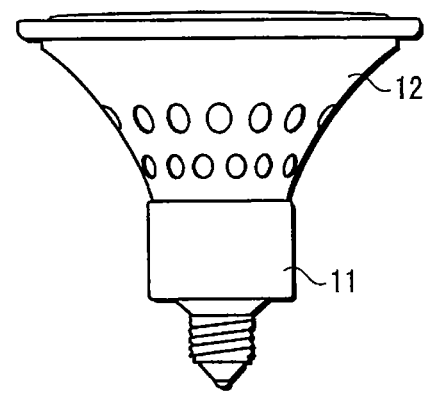

(4) According to Embodiment 1, the heat dissipator 12 is bowl-shaped, where the outer circumference of the circumferential wall portion 12b becomes larger from the bottom portion toward the opening edge, and the outer circumference converges to a constant value as it nears the opening edge. However, the present invention is not limited to such as long as the heat dissipator 12 can house the light-emitting module 18. For example, the heat dissipator 12 may be cylinder-shaped where the outer circumference of the circumferential wall portion is approximately constant from the bottom portion to the opening edge, as shown in FIG. 6A. Also, the heat dissipator 12 may be bowl-shaped where the circumferential wall portion 12b extends outwardly at a constant rate, as shown in FIG. 6B. Furthermore, the heat dissipator 12 may be bowl-shaped where the circumferential wall portion 12b extends outwardly and the outer circumference thereof increases as it nears the opening edge, as shown in FIG. 6C. Also, the shape of the heat dissipator 12 may be a shape obtained by combining these shapes.

(5) Although the plurality of windows 19 are provided in Embodiment 1, the effect of the present invention is obtained as long as at least one of the windows 19 is provided.

(6) According to Embodiment 1, the windows 19 are formed by closing off the through-holes by the translucent members. However, the present invention is not limited to such as long as the windows 19 transmit light. For example, the windows 19 may be through-holes which are not closed off by the translucent members.

Figure 7:
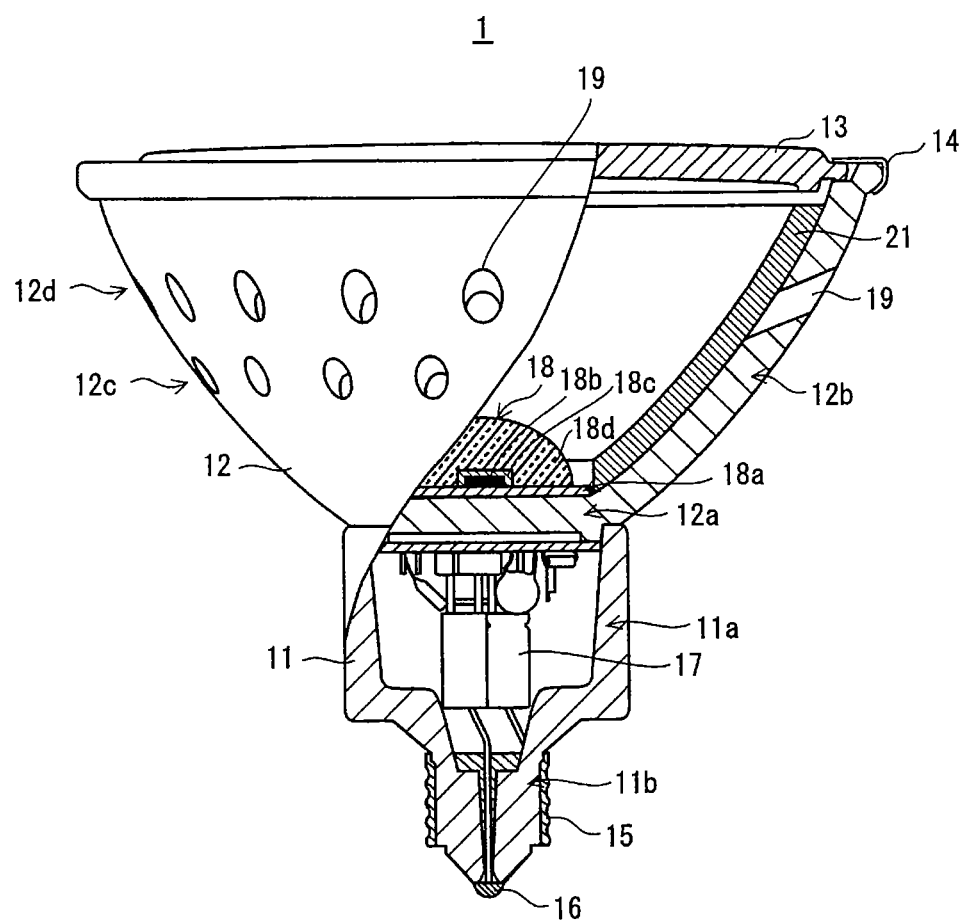
FIG. 7 shows a modification pertaining to a structure where the windows provided for the heat dissipator are closed off.
Figure 8A:
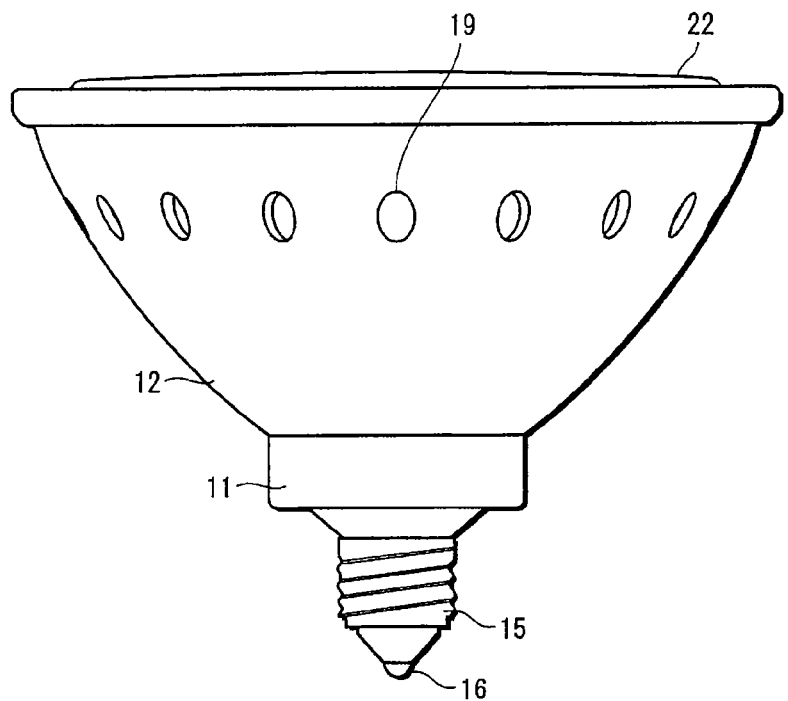
FIGS. 8A and 8B are a side view and a sectional view, respectively, showing a modification pertaining to the structure where the windows provided for the heat dissipator are closed off.
Figure 8B:
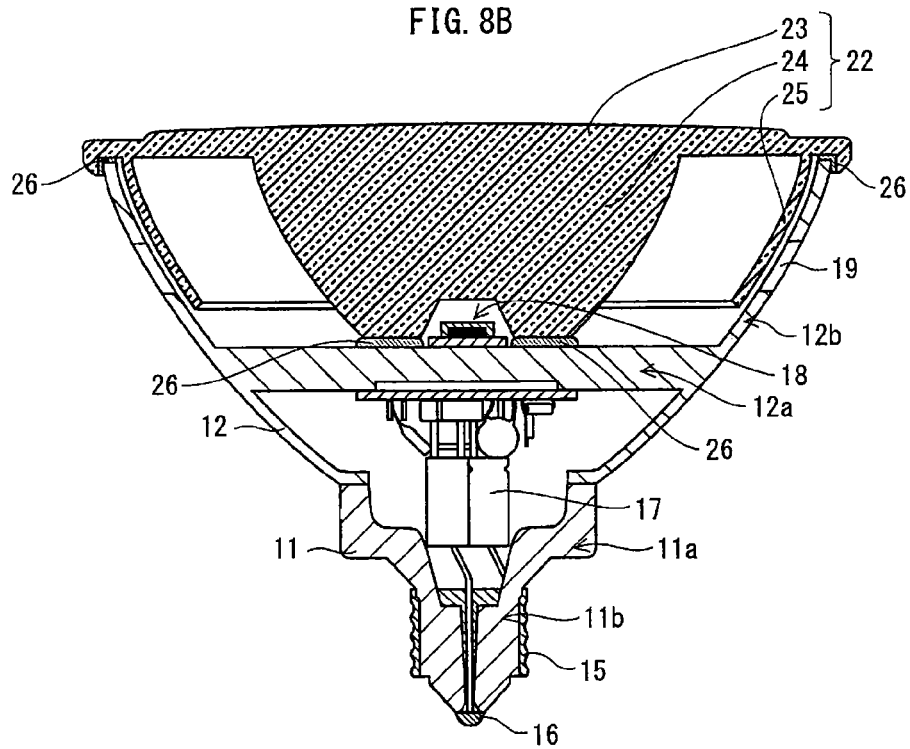
Figure 9A:
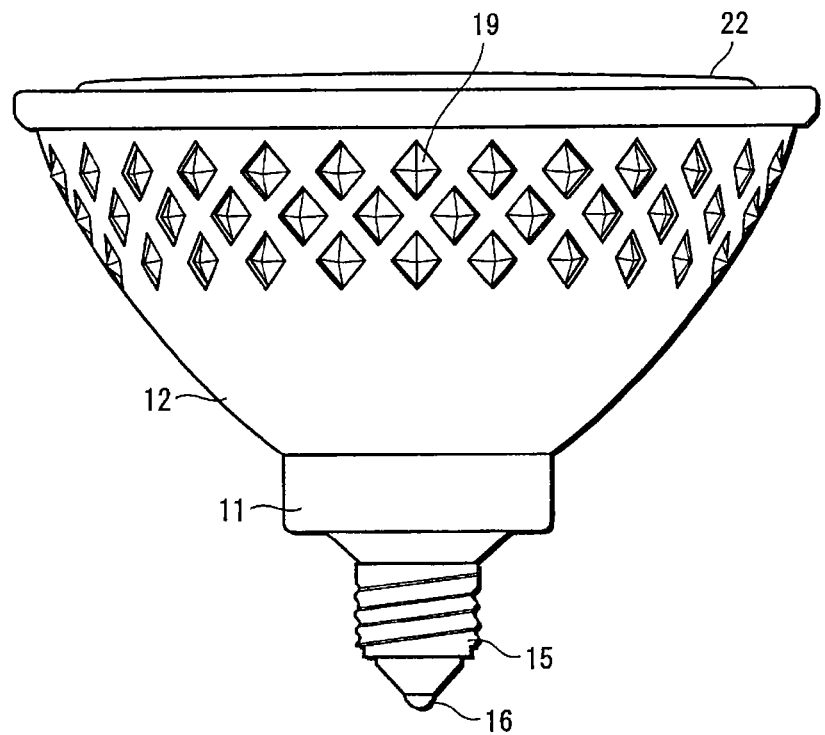
FIGS. 9A and 9B are a side view and a sectional view, respectively, showing a modification pertaining to the structure where the windows provided for the heat dissipator are closed off.
Figure 9B:
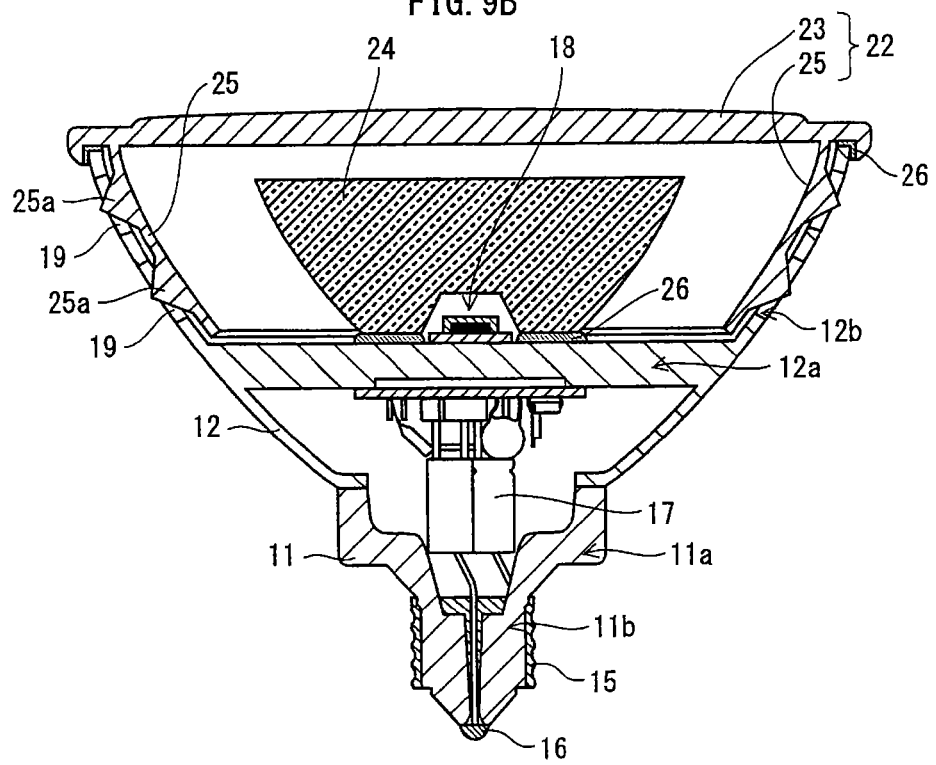

(7) According to Embodiment 1, the windows 19 have a structure where the translucent members are fit in the through-holes. However, the present invention is not limited to such in view of preventing the entrance of foreign substances. For example, it is possible to provide a circumferential cover, which is made of a translucent material, on one of inner and outer surfaces of the heat dissipator, or on both surfaces thereof, instead of fitting the translucent members in the through-holes. FIG. 7 shows an example where a circumferential cover 21 is provided on the inner surface of the heat dissipator 12. The circumferential cover 21 may be, for example, a molded product made of a translucent material or a sheet that is made of a translucent material and adhered to the inner surface of the heat dissipator 12. The translucent material may be, for example, resin, glass, or ceramics. Also, the circumferential cover 21 does not need to cover the entire inner surface of the heat dissipator 12, and may cover at least the openings of the windows 19. FIGS. 8A and 8B each show an example where a molded product 22 is provided for the heat dissipator 12. The molded product 22 is formed by integrating a front cover 23, a lens 24, and a circumferential cover 25. The molded product 22 and the heat dissipator 12 are fixed with use of an adhesive agent 26. Integration in the aforementioned manner simplifies the manufacturing process. In this example, the light-emitting module 18 does not include the lens. FIGS. 9A and 9B each show an example where projections 25a, each in the shape of a four-sided pyramid, are provided at positions of the circumferential cover 25 that correspond to the windows 19. In this way, light that passes through the windows 19 is scattered by the projections 25a, thereby further improving the "perceived radiance" of the lighting apparatus 1. The shape of the projections 25a is not limited to a four-sided pyramid. For example, the projections 25a may be in the shape of another polygonal pyramid (e.g., a three-sided pyramid, a five-sided pyramid, or a six-sided pyramid) or in the shape of a cone. In this example, the molded product 22 is formed by integrating the front cover 23 and the circumferential cover 25, but the lens 24 is provided separately from the molded product 22.

(8) According to Embodiment 1, the direction of the central axis of each window 19 is set such that the light-emitting module 18 is located on the extended line of the central axis. However, the present invention is not limited to such as long as the windows 19 leak light. For example, the central axis of each window 19 may be perpendicular to a surface of the circumferential wall portion 12b or to the central axis of the heat dissipator 12 that is bowl-shaped (an optical axis of the light-emitting module 18).

(9) According to Embodiment 1, the light-emitting device is an LED device. However, the present invention is not limited to such. For example, the light-emitting device may be an organic EL device.

(10) According to Embodiment 1, the heat dissipator 12 also serves as a reflector. However, the present invention is not limited to such. For example, a black coating material may be applied to the inner circumferential surface of the heat dissipator 12, so that the inner circumferential surface is not reflective.

(11) According to Embodiment 1, the windows 19 are provided in the circumferential wall portion 12b of the heat dissipator 12. However, it is not limited to such. The windows 19 may be provided at the bottom portion 12a of the heat dissipator 12. In the case of providing the windows 19 at the bottom portion 12a, the windows 19 need to be provided in an area not covered by the case 11 so as to leak light outside.

Figure 10A:
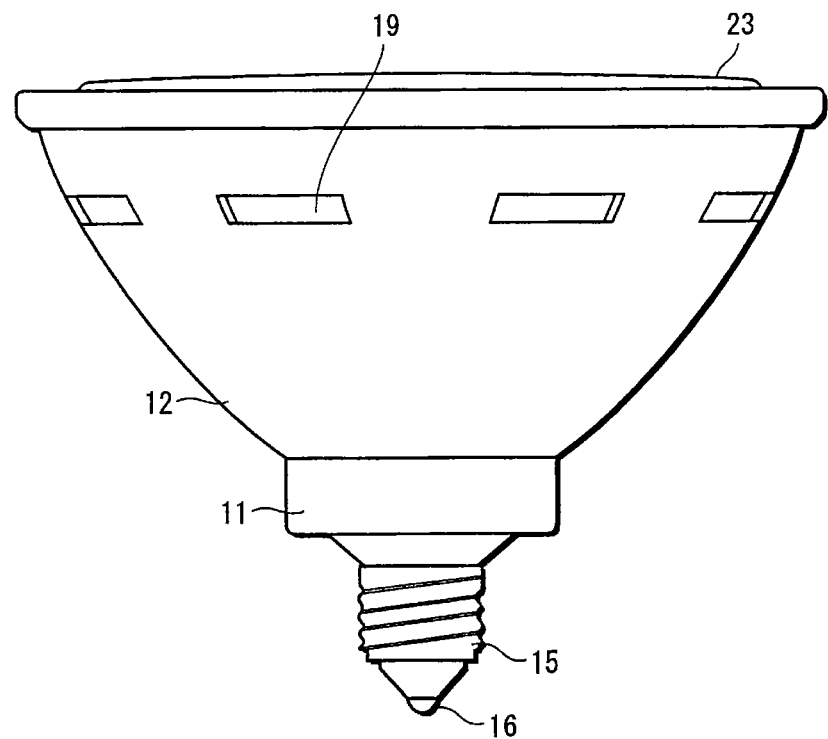
FIGS. 10A and 10B are a side view and a sectional view, respectively, showing a modification pertaining to a structure for guiding light toward the windows provided for the heat dissipator.
Figure 10B:
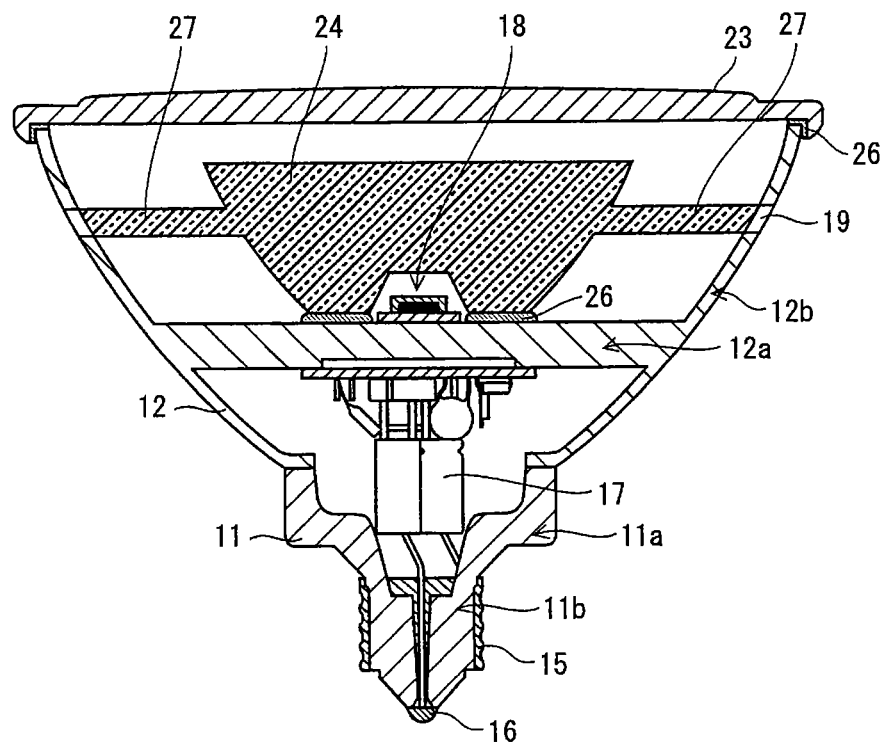
Figure 11A:
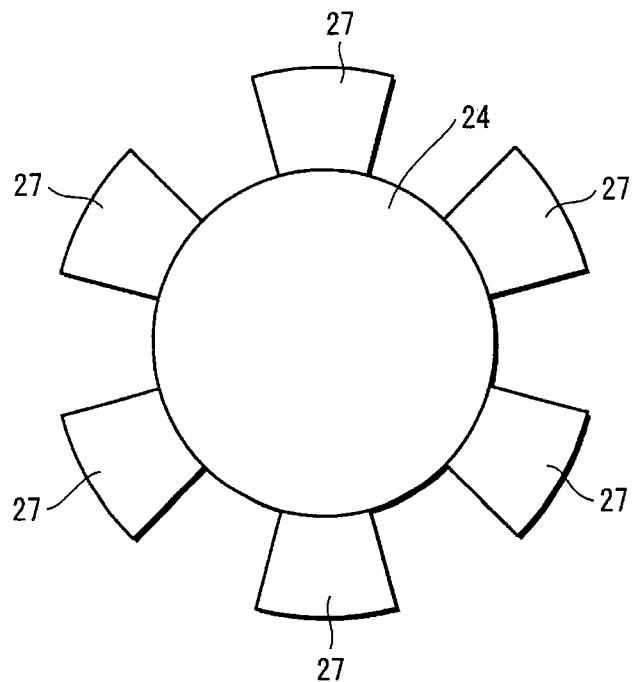
FIGS. 11A, 11B, and 11C are a top view, a side view, and a bottom view, respectively, showing a structure of a lens and a light guiding member according to the modification shown in FIGS. 10A and 10B.
Figure 11B:
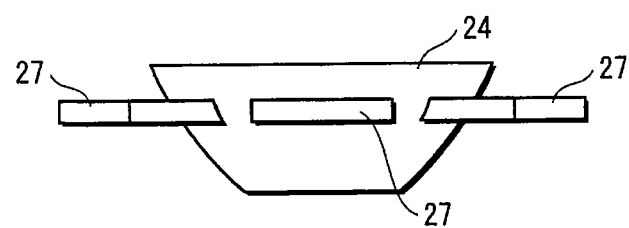
Figure 11C:
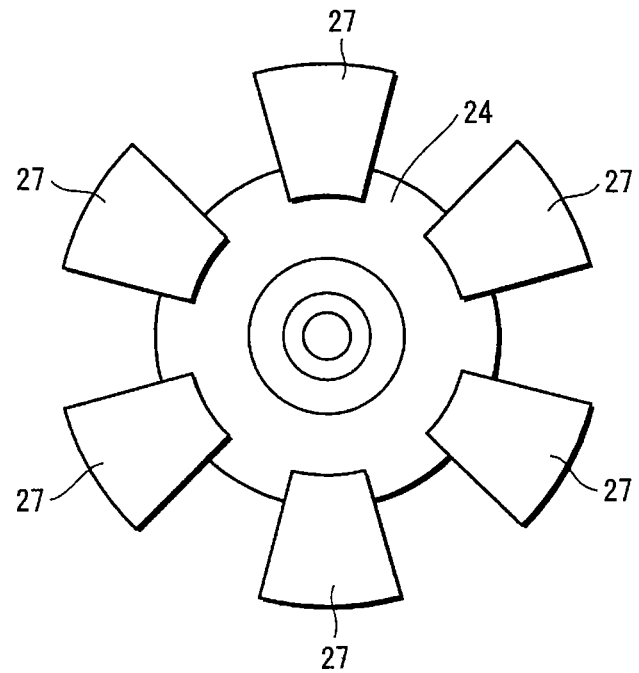
Figure 12A:
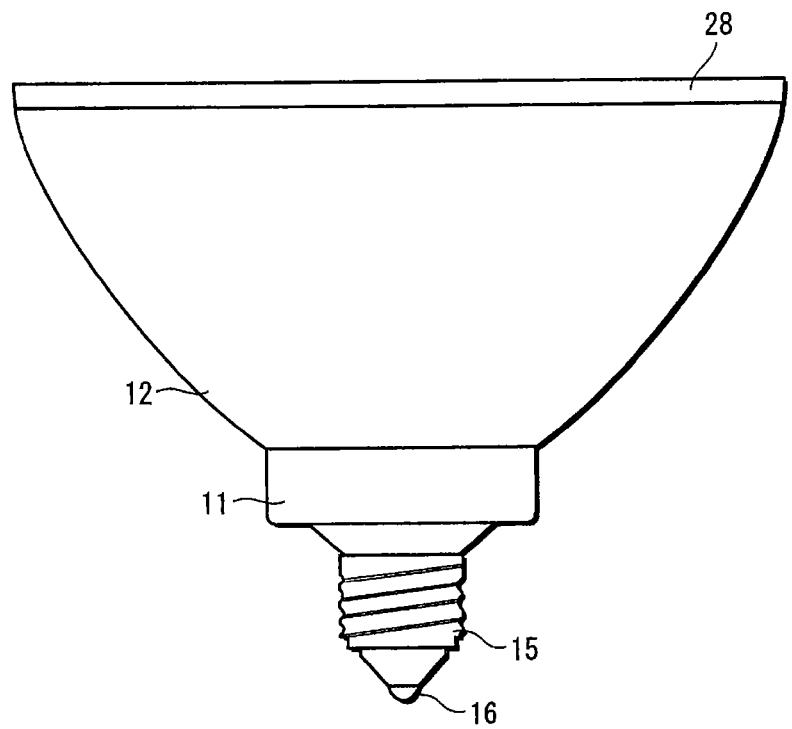
FIGS. 12A and 12B are a side view and a sectional view, respectively, showing an example of the light guiding member also serving as a front cover.
Figure 12B:
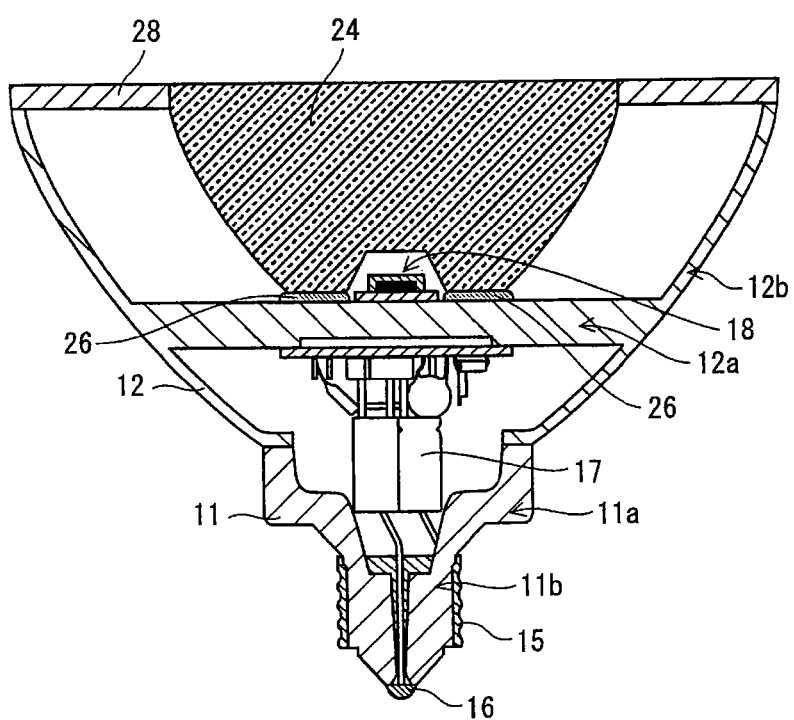
Figure 13A:
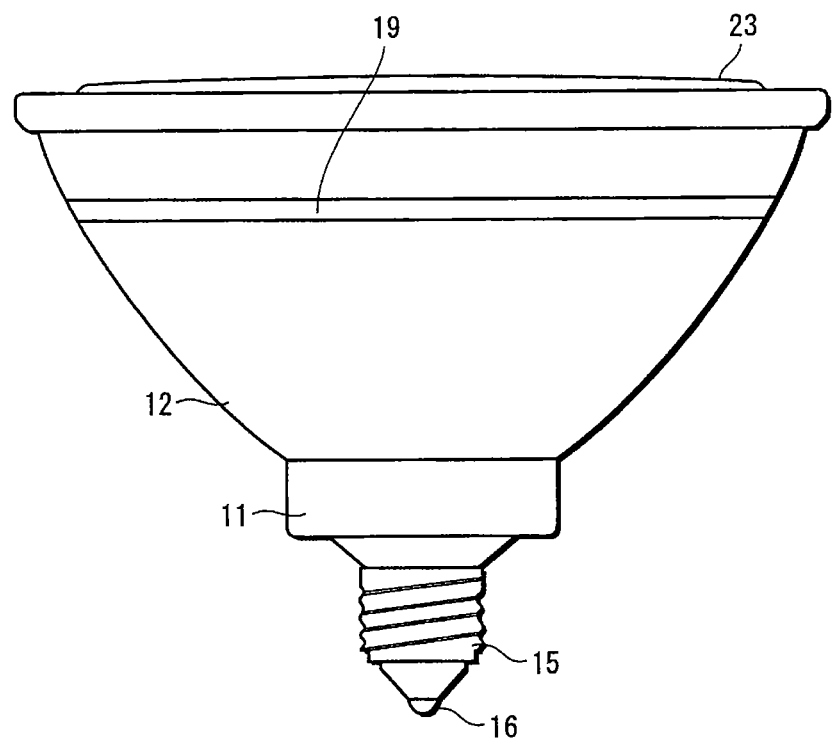
FIGS. 13A and 13B are a side view and a sectional view, respectively, showing a modification pertaining to a structure of the windows provided in the heat dissipator.
Figure 13B:
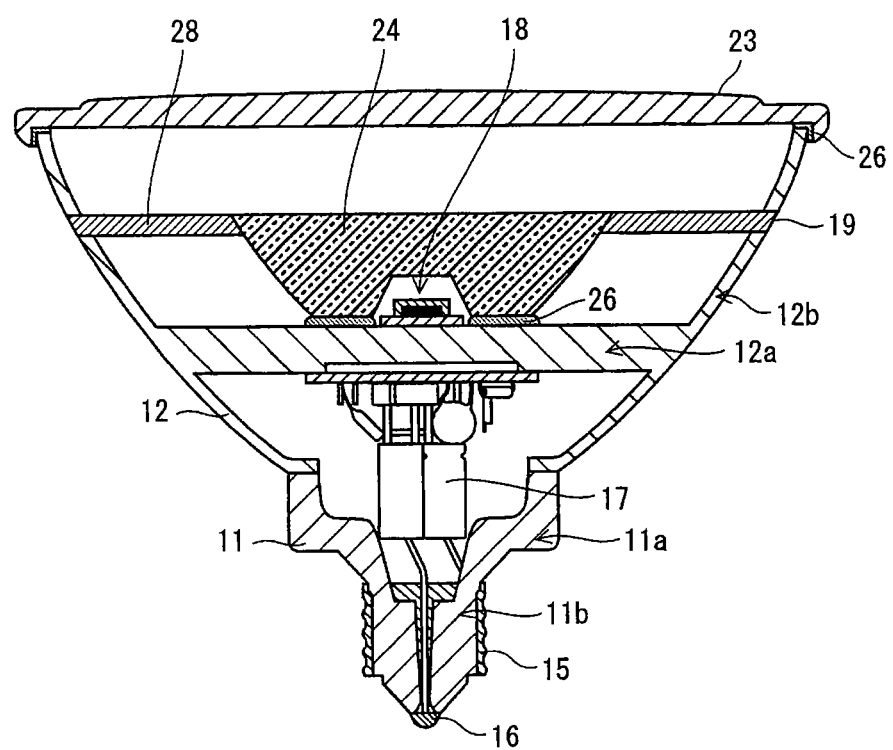

(12) According to Embodiment 1, only the light naturally reached the windows 19 is leaked from the windows 19. However, the present invention is not limited to such. For example, light may be positively guided toward the windows 19. FIGS. 10A and 10B each show an example where light guiding members 27, which guide light emitted from the light-emitting module 18 toward the windows 19, are provided in the heat dissipator 12. The light guiding members 27 are made of a translucent material. The light guiding members 27 are provided at positions that are on the circumferential surface of the lens 24, and that correspond to the windows 19. FIGS. 11A, 11B, and 11C each show an example of the structure of the lens 24 and the light guiding members 27 shown in FIGS. 10A and 10B. Since the windows 19 in the circumferential wall portion 12b of the heat dissipator 12 are provided at equal intervals in the circumferential direction, the light guiding members 27 on the circumferential surface of the lens 24 are also provided at equal intervals in the circumferential direction. According to the stated structure, light is positively guided toward the windows 19, thus increasing the amount of light leaked from the windows 19. Also, as shown in FIGS. 12A and 12B, a light guiding member 28 may also serve as a front cover. In this example, the light guiding member 28 is disc-shaped with an opening at the center, so as to expose a light-emitting surface of the lens 24 from the opening. The light guiding member 28 is made of, for example, translucent ceramics or the like. Also, as shown in FIGS. 13A and 13B, the windows 19 may be formed by exposing the circumferential surface of the light guiding member 28 from the circumferential wall portion 12b of the heat dissipator 12.

Figure 14A:
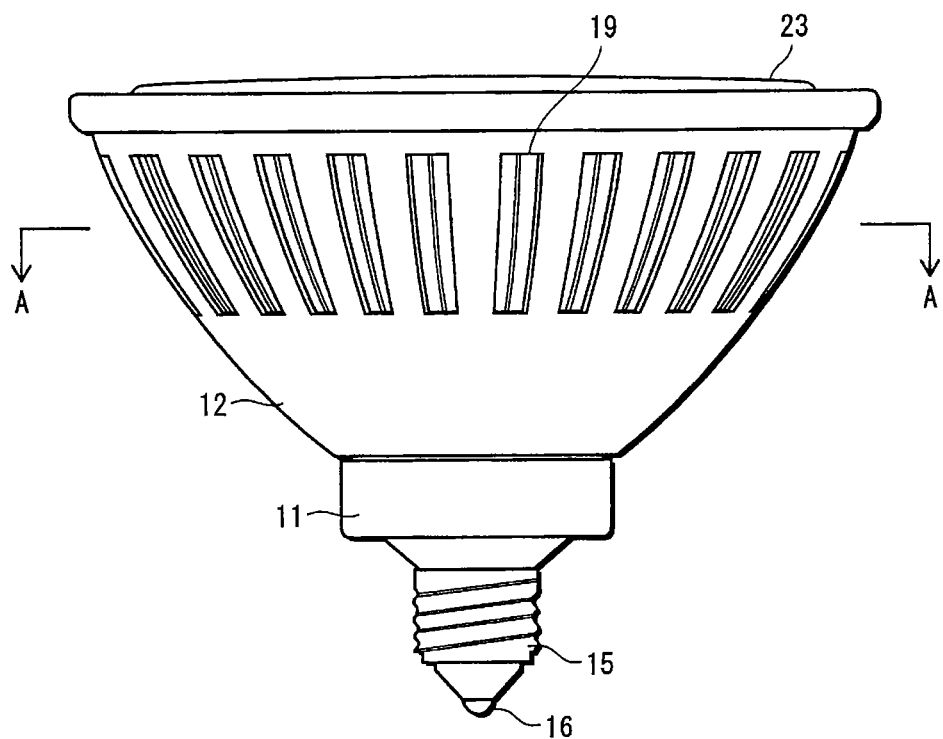
FIGS. 14A and 14B are a side view and a sectional view, respectively, showing a modification pertaining to a structure of the windows provided in the heat dissipator.
Figure 14B:
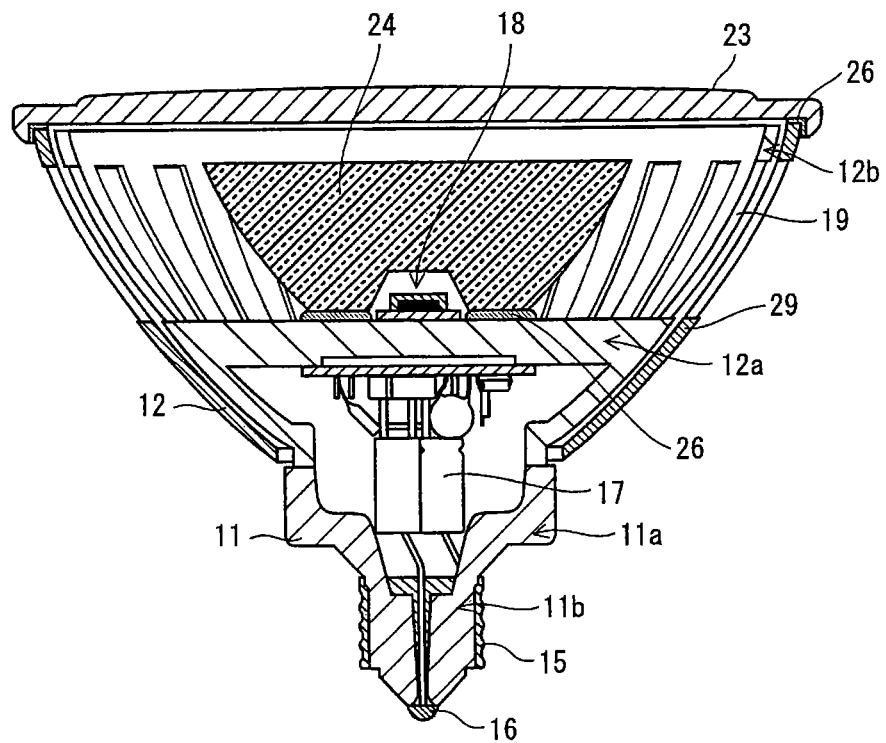
Figure 15A:
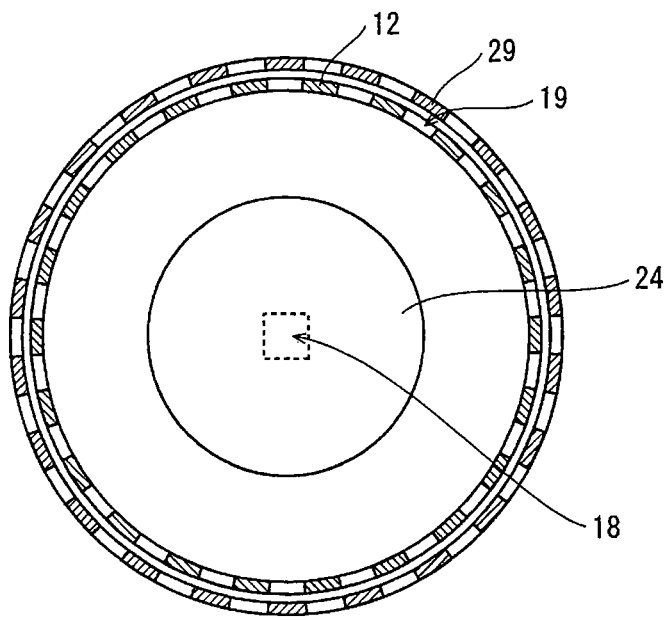
FIGS. 15A and 15B each show how the opening area of each window is changed, in the modification shown in FIGS. 14A and 14B.
Figure 15B:
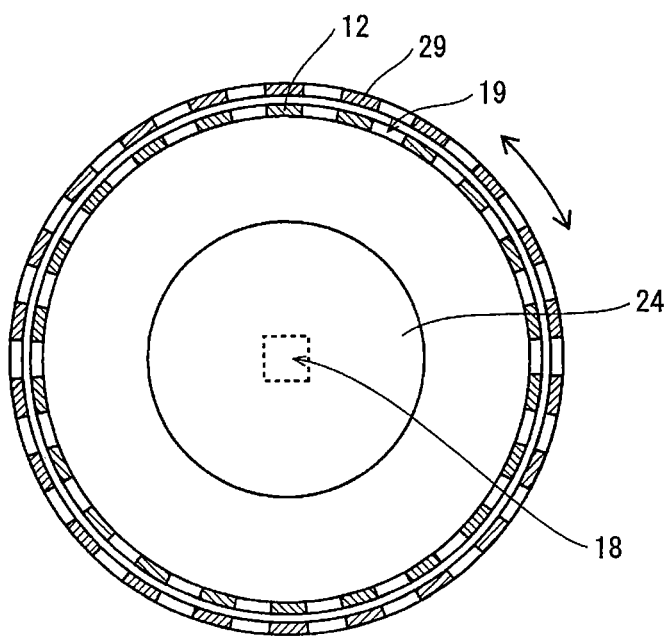

(13) According to Embodiment 1, the opening area of each window 19 is fixed. However, the present invention is not limited to such. For example, the opening area of each window 19 may be changeable. FIGS. 14A and 14B each show an example where a shutter 29 is provided so as to change the opening area of each window 19. As shown in FIGS. 14A and 14B, the windows 19 that are slit-shaped are provided in the circumferential wall portion 12b of the heat dissipator 12 at equal intervals in the circumferential direction. The shutter 29 is made of a metal material, such as aluminum, or a non-translucent ceramic material. The shutter 29 is in the shape of a cylinder that fits on an outer surface of the circumferential wall portion 12b of the heat dissipator 12. Also, the shutter 29 has slit-shaped through-holes at positions corresponding to the windows 19. The circumferential wall portion 12b of the heat dissipator 12 is fixed to the case 11, but not to the front cover 23. On the other hand, the shutter 29 is not fixed to the case 11, but to the front cover 23. This realizes a structure where the shutter 29 is rotatable in the circumferential direction of the circumferential wall portion 12b. By rotating the shutter 29, the positional relationship between the windows 19 of the circumferential wall portion 12b and the through-holes of the shutter 29 is changed. This enables changing the opening area of each window 19. FIGS. 15A and 15B each show how the opening area of each window 19 is changed. By changing the opening area of each window 19, the amount of light leaked from the circumferential wall portion 12b of the heat dissipator 12 is adjusted.

In the above example, the shutter 29 is in contact with the outer surface of the circumferential wall portion 12b of the heat dissipator 12. However, it is not limited to such. For example, the shutter 29 may be in contact with the inner surface of the circumferential wall portion 12b. Also, in a case where the heat dissipator 12 is cylinder-shaped as shown in FIG. 6A, the opening area of each window 19 may be changed by sliding the shutter 29 in a direction of a cylindrical axis of the heat dissipator 12. Also, the windows 19 do not always need to be slit-shaped, and may take any shape.

Figure 16:
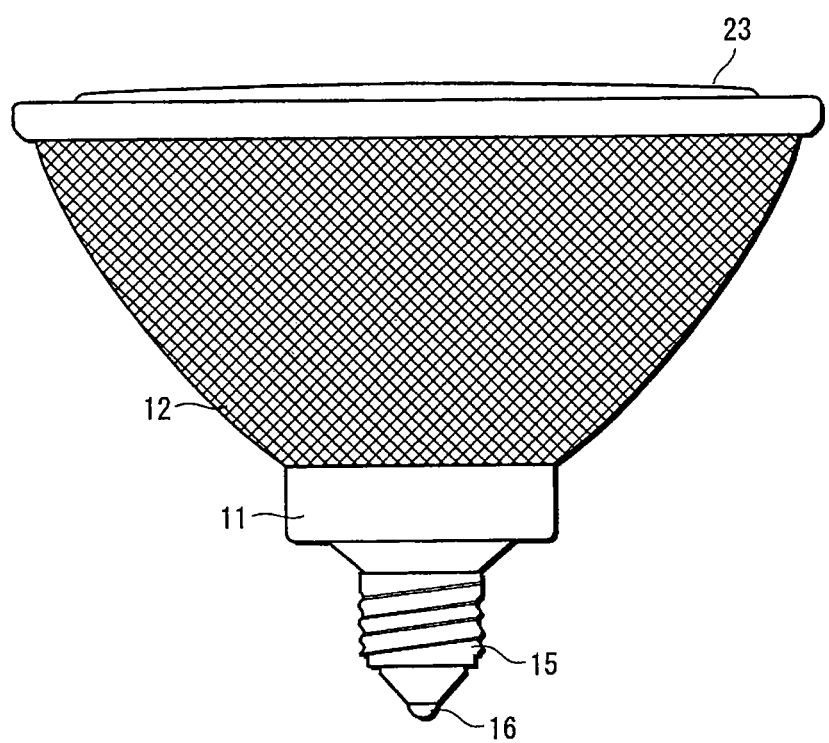
FIG. 16 shows a modification pertaining to the shape of the windows provided in the heat dissipator.
Figure 17:
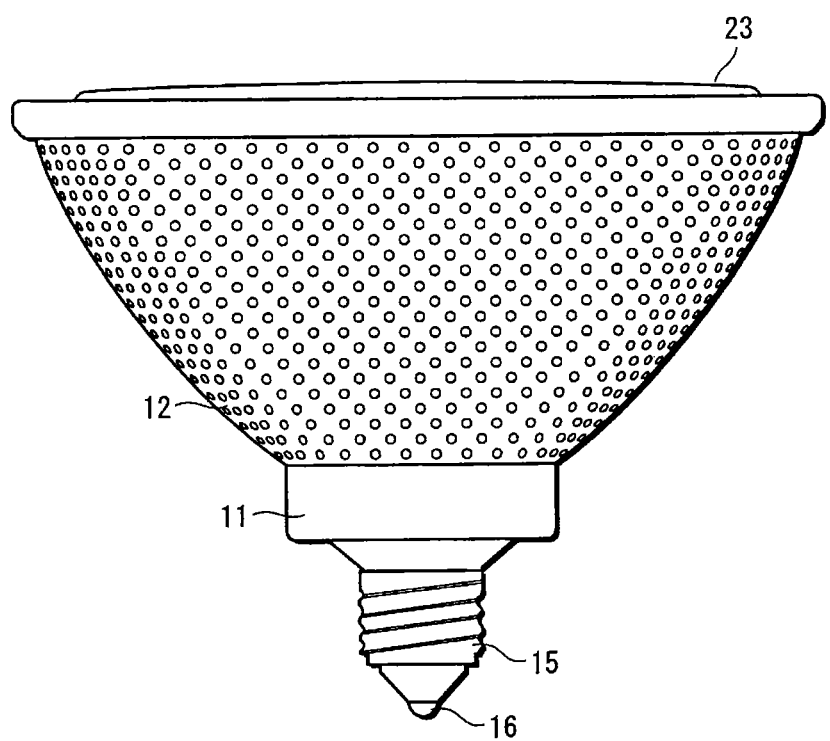
FIG. 17 shows a modification pertaining to the shape of the windows provided in the heat dissipator.

(14) According to Embodiment 1, the windows 19 are formed by providing through-holes in the circumferential wall portion 12b of the heat dissipator 12. However, the present invention is not limited to such. For example, the circumferential wall portion of the heat dissipator 12 may be formed by a metal mesh, as shown in FIG. 16. Alternatively, the circumferential wall portion of the heat dissipator 12 may be formed by a punching metal, as shown in FIG. 17. According to this structure, light is leaked from the entire circumferential wall portion of the lighting apparatus 1. Leaking the light in such a manner is similar to how the light of a conventional reflector halogen lamp is leaked. Also, it is possible to reduce the weight of the entirety of the lighting apparatus, compared to Embodiment 1. Furthermore, since the heat dissipator 12 has a number of small through-holes, the flow speed of air that passes from the inside to the outside of the heat dissipator 12 by convection is increased, thus improving heat dissipation effect. In the case of the metal mesh, the diameter of wire is preferably in the range of 0.1 mm to 0.5 mm. In the case of the punching metal, the diameter of each punching hole is preferably in the range of 0.1 mm to 2.0 mm. Also, in the case of the punching metal, the area of the through-holes with respect to the surface area of the heat dissipator 12 is preferably less than or equal to 50%.

(15) According to Embodiment 1, the light-emitting module 18 includes the metal substrate. However, the present invention is not limited to such as long as the heat conductivity is relatively high. For example, the light-emitting module 18 may include a ceramics substrate instead of the metal substrate.

Figure 18A:
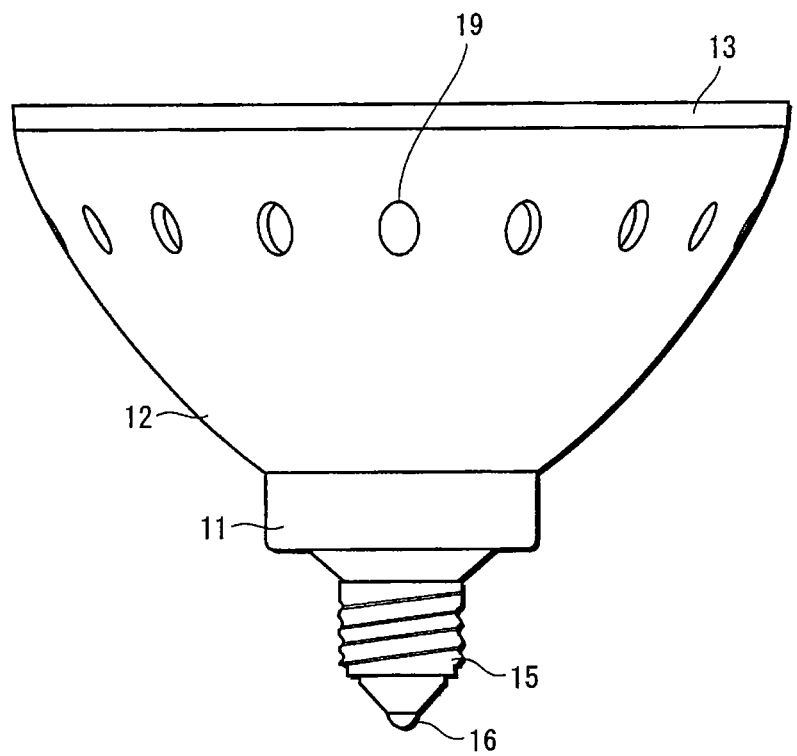
FIGS. 18A and 18B each show a modification pertaining to a structure of the opening of the heat dissipator.
Figure 18B:
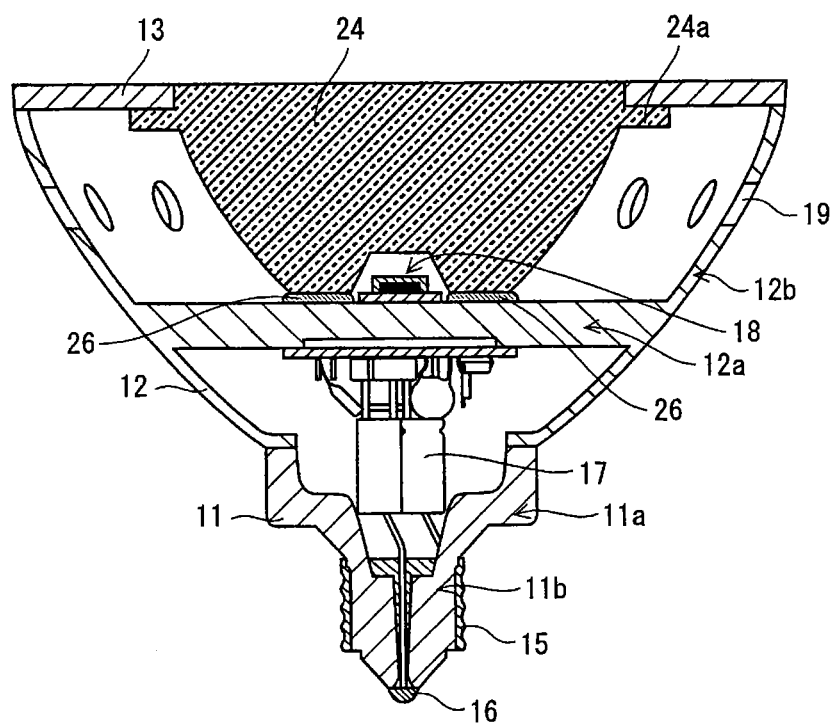

(16) According to Embodiment 1, light is emitted from the entire area of the opening of the heat dissipator 12. However, the present invention is not limited to such, and light may be emitted from a part of the area of the opening of the heat dissipator 12. FIGS. 18A and 18B each show a modification pertaining to a structure of the opening of the heat dissipator. The front cover 13 is made of a non-translucent material, and is disc-shaped with an opening at the center, so as to expose a light-emitting surface of the lens 24 from the opening. The non-translucent material may be, for example, a metal material, a non-translucent ceramic material or a non-translucent resin material. In the case of employing a highly heat conductive material, such as a metal material, the heat dissipation characteristics of the lighting apparatus are improved.

Also, in this example, protrusions 24a are provided on a circumferential surface of the lens 24 in a manner that the protrusions 24a make contact with the front cover 13. This makes it possible to firmly fix the lens 24.

Embodiment 2

Figure 19:
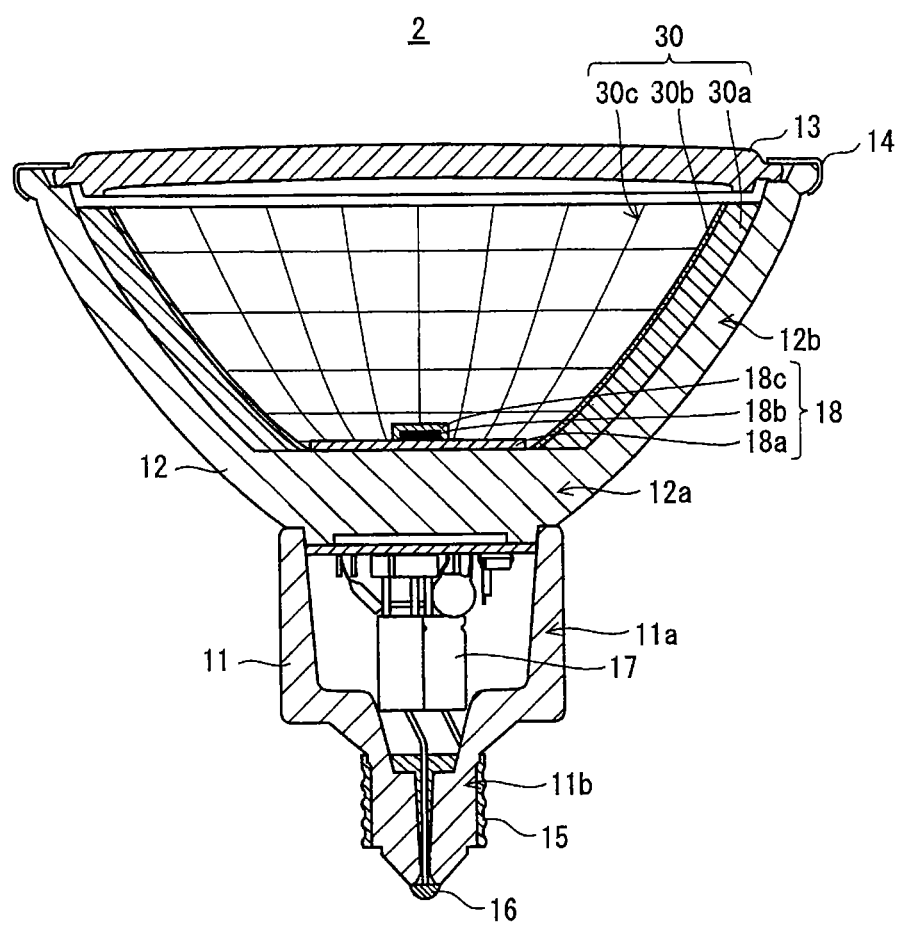
FIG. 19 is a sectional view showing a structure of a lighting apparatus according to Embodiment 2 of the present invention.

FIG. 19 is a sectional view showing a structure of a lighting apparatus according to Embodiment 2 of the present invention.

A lighting apparatus 2 mainly includes the case 11, the heat dissipator 12, the light-emitting module 18, and a reflector 30. Embodiment 2 is different from Embodiment 1 in that: win-dows are not formed in the heat dissipator 12; the light-emitting module 18 does not include any lens; and the lighting apparatus 2 includes the reflector 30. Aside from these differences, Embodiment 2 has the same structure as Embodiment 1; therefore, descriptions thereof are omitted.

The reflector 30 is fixed inside the heat dissipator 12 with use of an adhesive agent, a screw, or the like. Since an outer circumferential surface of the reflector 30 is in contact with the inner circumferential surface of the heat dissipator 12, the mechanical strength is ensured to a certain degree even when the reflector 30 is made thinner. An opening is provided at a bottom portion of the reflector 30 so as to expose the light-emitting module 18. The light-emitting module 18 is disposed in the opening.

The reflector 30 is composed of a base 30a and a reflective film 30b. The base 30a is bowl-shaped, and has facets 30c formed thereon. The base 30a is made of a material on which the facets 30c can be easily formed. Examples of such a material include resin and glass. The reflective film 30b is made of a metal film or a dielectric multilayer film. The reflective film 30b may be made of not only a dielectric multilayer film but also a metal film, because light emitted from an LED device has a smaller infrared component than light emitted from a halogen lamp.

According to the stated structure, heat generated by the light-emitting module 18 is conducted to the heat dissipator 12 and thereby dissipated. This ensures high heat dissipation characteristics. Also, since the base 30a of the reflector 30 is made of either resin or glass, the facets 30c can be easily formed on the base 30a. Furthermore, since the heat dissipator 12 and the reflector 30 are separate members, a structure is possible where the heat dissipator 12 is commonly used while the reflector 30 is different depending on a light distribution pattern. This greatly reduces the manufacturing cost of the lighting apparatus.

Embodiment 3

Figure 20:
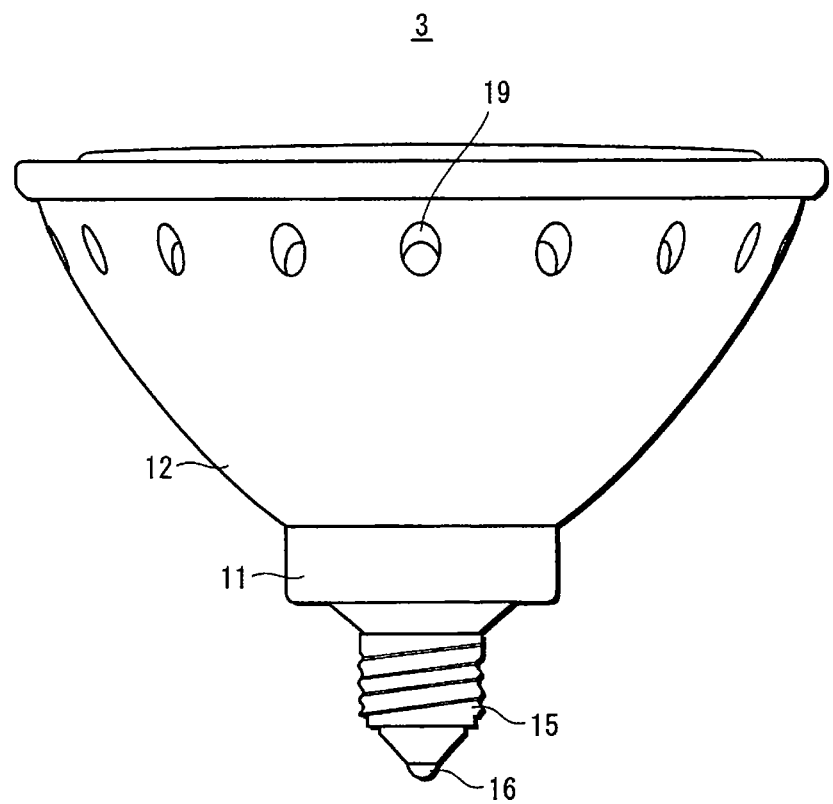
FIG. 20 is a side view showing a structure of a lighting apparatus according to Embodiment 3 of the present invention.
Figure 21:
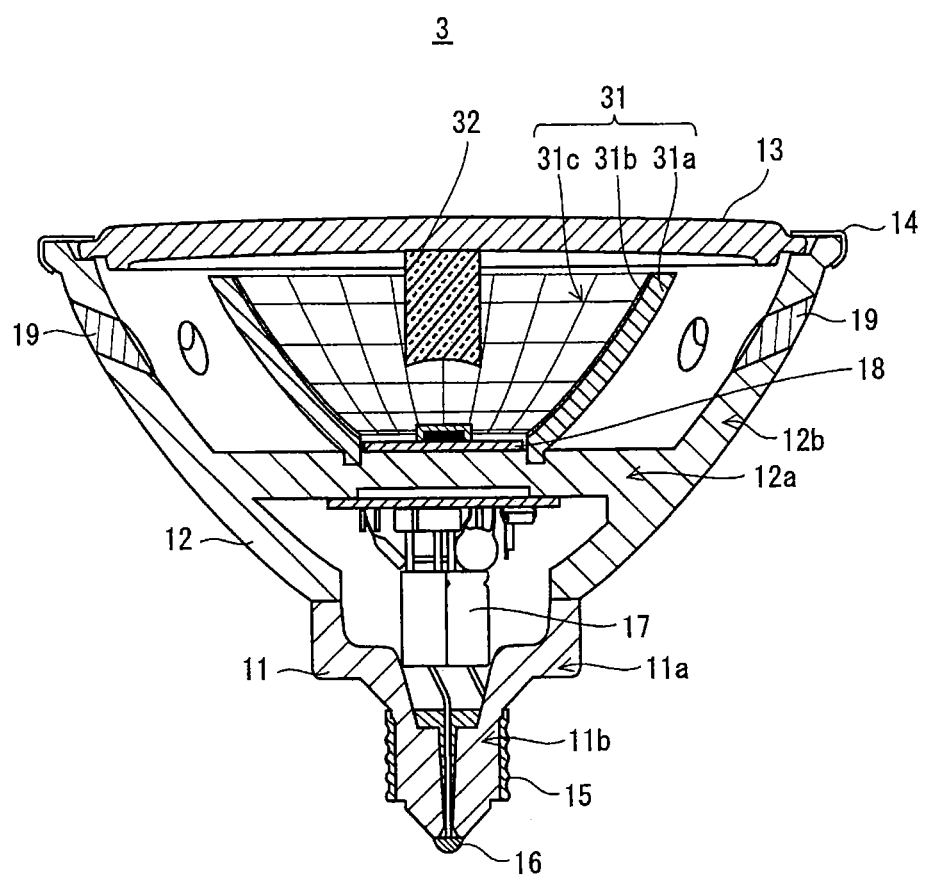
FIG. 21 is a sectional view showing the structure of the lighting apparatus according to Embodiment 3 of the present invention.

FIG. 20 is a side view showing a structure of a lighting apparatus according to Embodiment 3 of the present invention. FIG. 21 is a sectional view showing the structure of the lighting apparatus according to Embodiment 3 of the present invention. A lighting apparatus 3 according to Embodiment 3 is the same as the lighting apparatus 2 of Embodiment 2 in terms of the basic structure. The following describes differences between Embodiments 2 and 3.

In Embodiment 3, the bottom portion 12a of the heat dissipator 12 is raised, and the circumferential wall portion 12b has the windows 19. The length of the cylindrical portion 11a of the case 11, in an axis direction thereof, is shortened by the amount of the bottom portion 12a being raised.

A reflector 31 is fixed at the bottom portion 12a of the heat dissipator 12. The reflector 31 is fixed by, for example, screwing the reflector 31 into a groove provided in the bottom portion 12a or adhering the reflector 31 to the bottom portion 12a using an adhesive agent. The length of the reflector 31 in an axis direction thereof is shortened by the amount of the bottom portion 12a of the heat dissipator 12 being raised. Also, since the reflector 31 is set up from the periphery of the light-emitting module 18, an outer circumferential surface of the reflector 31 is spaced apart from the inner circumferential surface of the heat dissipator 12. The base 31a of the reflector 31 is made of a material that is translucent and on which facets can be easily formed. Examples of such a material include translucent resin and glass. A reflective film 31b of the reflector 31 is made of a dielectric multilayer film that transmits part of light emitted from the light-emitting module 18 (e.g., part of visible light).

The front cover 13 is provided with a sub-reflector 32 for reflecting direct light from the light-emitting module 18 toward the reflector 31. The "direct light" refers to light emitted forward (i.e., toward the opening of the heat dissipator 12) without being reflected by the reflector 31.

According to the stated structure, the bottom portion 12a of the heat dissipator 12 is raised, thereby reducing the size of the entirety of the lighting apparatus. Furthermore, by providing the sub-reflector 32, the length of the reflector 31 in the axis direction thereof is shortened. As a result, the size of the entirety of the lighting apparatus is further reduced.

Also, the reflective film 31b is made of the dielectric multilayer film that transmits part of emitted light, and the circumferential wall portion 12b of the heat dissipator 12 has the windows 19. In this way, light from the light-emitting module 18 is emitted outwardly from the opening of the heat dissipator 12, and also leaked from the circumferential wall portion 12b of the heat dissipator 12. This improves the "perceived radiance" of the lighting apparatus 3.

Also, since the reflector 31 is spaced apart from the inner circumferential surface of the heat dissipator 12, the shape of the reflector 31 does not need to match the shape of the heat dissipator 12, and can be designed arbitrarily according to the light distribution pattern.

Note that the modifications (1) to (16) of Embodiment 1 are equally applicable to the heat dissipator 12, the light-emitting module 18, and the windows 19 according to Embodiments 2 and 3.

INDUSTRIAL APPLICABILITY

The present invention is applicable to, for example, a lighting apparatus that substitutes for a reflector halogen lamp.

REFERENCE SIGNS LIST

1, 2, and 3 lighting apparatus
11 case
11a cylindrical portion
11b protrusion
12 heat dissipator
12a bottom portion
12b circumferential wall portion
12c circumferential area
12d circumferential area
12e inner circumferential wall portion
12f outer circumferential wall portion
13 front cover
14 metal fitting
15 shell
16 eyelet
17 lighting circuit
18 light-emitting module
18a metal substrate
18b LED device
18c silicone resin member
18d lens
19 window
19c central axis
20 feed pin
21 circumferential cover
22 molded product
23 front cover
24 lens
24a protrusion
25 circumferential cover
25a projection
26 adhesive agent
27 and 28 light guiding member
29 shutter
30 and 31 reflector
30a and 31a base
30b and 31b reflective film
30c and 31c facet
32 sub-reflector

The invention claimed is:

1. A lighting apparatus comprising:
a heat dissipater that is in one of a bottomed cylindrical shape and a bowl shape, and that has a bottom portion, a circumferential wall portion, and an upper opening; and
a light-emitting device that is provided in an inside of the heat dissipater at the bottom portion and is operable to emit light through the upper opening and towards the circumferential wall portion, wherein
the circumferential wall portion has one or more windows for leaking a portion of the emitted light to illuminate an outside of the heat dissipater,
the circumferential wall portion has an inner surface and an outer surface,
the light-emitting device is provided in a space defined by the inner surface of the circumferential wall, and
the windows are through-holes that pass through the inner surface and the outer surface of the circumferential wall portion, and each throughhole is closed off by a translucent member that transmits the portion of the emitted light.

2. The lighting apparatus of claim 1, wherein
the windows are provided at equal intervals in a circumferential direction of the circumferential wall portion.

3. The lighting apparatus of claim 1, wherein
a size of each window is such that the closer the window is to the upper opening of the heat dissipater, the larger the size of the window is.

4. The lighting apparatus of claim 1, wherein
each window is provided in a part of the circumferential wall portion located between first and second virtual planes, the first virtual plane including the opening of the heat dissipater, the second virtual plane passing through the light-emitting device and being perpendicular to a central axis of the heat dissipater that is in one of the bottomed cylindrical shape and the bowl shape.

5. The lighting apparatus of claim 1, wherein
the translucent member is colorless.

6. The lighting apparatus of claim 1, wherein
the translucent member is a color filter.

7. The lighting apparatus of claim 1, wherein
the heat dissipater also serves as a reflector.

8. The lighting apparatus of claim 1, wherein
the heat dissipater is made of one of a metal material, a non-translucent ceramic material, and a non-translucent resin material.

9. The lighting apparatus of claim 8 further comprising
a heat-conductive member that is provided between the light-emitting device and the bottom portion of the heat dissipater.

10. The lighting apparatus of claim 1 further comprising:
a case fixed to an outer surface of the bottom portion of the heat dissipator; and
a lighting circuit housed in the case, the case having a metal shell and a metal eyelet that serve as electrical feed terminals for mounting in an external power source.

11. A lighting apparatus to replace a halogen lamp comprising:
- a heat dissipater that has a bowl shape with a flat bottom portion, an annular circumferential wall portion extending upward from the flat bottom portion, and an upper opening; and
- a light-emitting LED device is provided inside the heat dissipater on the bottom portion and is operable to emit light through the opening and towards the circumferential wall portion, wherein
- the annular circumferential wall portion has a plurality of spaced windows for emitting a portion of the emitted light through and around the circumferential wall portion to illuminate an outside of the heat dissipater to simulate a surrounding light of halogen lamps,
- the annular circumferential wall portion has a reflector inner surface that reflects light through the upper opening and an outer surface,
- the light-emitting LED device is provided in a space defined by the reflector inner surface of the annular circumferential wall, and
- the plurality of spaced windows are through-holes that pass through the inner surface and the outer surface of the annular circumferential wall portion to simulate the surrounding light of halogen lamps.

12. The lighting apparatus of claim 11 further comprising:
- a case fixed to an outer surface of the bottom portion of the heat dissipator;
- a lighting circuit housed in the case, the case having a metal shell and a metal eyelet that serves as electrical feed terminals for mounting in an external power source; and
- each throughhole is closed off by a transparent member that transmits the portion of the emitted light to simulate the surrounding light of halogen lamps.

\* \* \* \* \*